(12) United States Patent
Suzumura

(10) Patent No.: US 7,058,867 B2
(45) Date of Patent: Jun. 6, 2006

(54) LOGIC CIRCUIT AND METHODS FOR DESIGNING AND TESTING THE SAME

(75) Inventor: Tatsuhiro Suzumura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 426 days.

(21) Appl. No.: 10/442,225

(22) Filed: May 21, 2003

(65) Prior Publication Data

US 2004/0187057 A1    Sep. 23, 2004

(30) Foreign Application Priority Data

Mar. 17, 2003  (JP)  ............................. 2003-072217

(51) Int. Cl.
 *G01R 31/28* (2006.01)
(52) U.S. Cl. ..................... 714/726; 714/736
(58) Field of Classification Search ................ 714/726, 714/729, 727, 736, 731; 324/753; 365/201
See application file for complete search history.

(56) References Cited

U.S. PATENT DOCUMENTS

| | | | |
|---|---|---|---|
| 5,812,561 A * | 9/1998 | Giles et al. .................. 714/726 |
| 6,501,288 B1 * | 12/2002 | Wilsher ....................... 324/753 |
| 6,549,478 B1 * | 4/2003 | Suzuki ........................ 365/201 |
| 6,633,502 B1 * | 10/2003 | Iwasaki ....................... 365/201 |
| 6,760,876 B1 * | 7/2004 | Grannis, III ................ 714/729 |

FOREIGN PATENT DOCUMENTS

JP    9-5403    1/1997

* cited by examiner

*Primary Examiner*—David Ton
(74) *Attorney, Agent, or Firm*—Oblon, Spivak, McClelland, Maier & Neustadt, P.C.

(57) ABSTRACT

A logic circuit comprising a flip-flop chain circuit which is utilized in a scan test of a combinational circuit, the flip-flop chain circuit including a plurality of flip-flops each of which is provided with a selector.

19 Claims, 7 Drawing Sheets

US 7,058,867 B2

LOGIC CIRCUIT AND METHODS FOR DESIGNING AND TESTING THE SAME

CROSS-REFERENCE TO RELATED APPLICATIONS

This application is based upon and claims the benefit of priority from the prior Japanese Patent Application No. 2003-072217, filed Mar. 17, 2003, the entire contents of which are incorporated herein by reference.

BACKGROUND OF THE INVENTION

1. Field of the Invention

The present invention relates to a logic circuit and methods for designing and testing the same. More particularly, the present invention relates to a SCAN test flip-flop (hereinafter referred to as F/F) chain circuit which is used when conducting an operating frequency measurement test and a stress test on a logic circuit.

2. Description of the Related Art

Generally, a logic circuit under development is subject to an operating frequency measurement test and a stress test such as a burn-in test. An operating frequency measurement test is conducted to activate a path, that is, a maximum delay path (hereinafter called a critical path) having a maximum signal propagation time of a combinational circuit which constitutes a logic circuit, thereby measuring a maximum operating frequency (f-max) at which this path can propagate the signal. That is, this f-max measurement for measuring a maximum value of the operable frequency of a certain logic circuit is important in order to know characteristics of the logic circuit, so that an operating frequency measurement test for measuring an f-max is an indispensable test item in the development of the logic circuits.

FIG. 6 shows one example of a conventional operating frequency measurement test (f-max measurement). It is to be noted that the following will describe a case of performing the f-max measurement by the use of a SCAN test F/F chain circuit which is obtained by connecting a plurality of clock synchronization type F/Fs in the form of a SCAN chain.

To enable the f-max measurement, first, a process searches for a critical path 102 of a combinational circuit 101 based on a result of a timing analysis etc. Subsequently, the process identifies a first test vector (F/F set value for the critical path) which is to be set to, for example, each of a SCAN F/F(1) 103a to a SCAN F/F(5) 103e of a SCAN test F/F chain circuit 103. This first test vector is data for causing the critical path 102 to perform a desired function operation. Subsequently, the process identifies a second test vector (f-max measurement test vector) for use in a preliminary function operation in order to cause the critical path 102 to perform a desired function operation. That is, the process identifies a set value for each of a SCAN F/F(1) 103a−1 to a SCAN F/F(5) 103e−1 which are one cycle before the desired function operation so that the first test vector may be identified. Such a procedure has been followed conventionally in order to create a test vector that enables the f-max measurement.

The second test vector thus identified is applied from the outside of the circuit and sequentially set to each of the SCAN F/F(1) 103a−1 to the SCAN F/F(5) 103e−1 of the F/F chain circuit 103. More specifically, for example, as shown in FIG. 7, in actual f-max measurement, in order to activate the critical path 102, data which serves to identify a set value for each of the SCAN F/F(l) 103a to the SCAN F/F(5) 103e of the F/F chain circuit 103, that is, a second test vector D0[n] ([n]=[F/F(1)] to [F/F(5)] in this case) is set to each of the SCAN F/F(1) 103a−1 to the SCAN F/F(S) 103e−1 of the F/F chain circuit 103. Upon completion of setting of the second test vector D0[n], three cycles of a SCAN F/F clock signal clk are applied to the F/F chain circuit 103.

The first cycle of the clock signal clk permits an F/F set value for the critical path identified on the basis of the second test vector D0[n], that is, the first test vector D1[n] which is used to cause the critical path 102 to perform a desired function operation, to be set to each of the SCAN F/F(1) 103a to the SCAN F/F(5) 103e of the F/F chain circuit 103 at a time. This brings about the activation of the critical path 102 to perform a desired function operation based on the first test vector D1[n].

The second cycle of the clock signal clk causes a result D2[n] of its performing to be set to each of a SCAN F/F(1) 103a+1 to a SCAN F/F(5) 103e+1 of the F/F chain circuit 103. The set value D2[n] for each of these SCAN F/F(1) 103a+1 to SCAN F/F(5) 103e+1 after passed through the critical path 102 is compared to an expected value which is predicted on the basis of a design value of the combinational circuit 101. In such a manner, there is obtained an operating frequency that marginally agrees with the expected value, that is, a maximum operable frequency value (maximum operating frequency).

This operation frequency measurement test has a problem that it takes much time to identify the second test vector D0[n]. That is, it is very difficult to identify a test vector (f-max measurement test vector) which causes the critical path 102 to perform a desired function operation and which is obtained one cycle before the operation, and only for this identification, much time is required.

As far as the above-mentioned conventional method is used, from the viewpoint of characteristics of the f-max measurement, it is impossible to set the second test vector D0[n] directly to each of the SCAN F/F(1) 103a to the SCAN F/F(5) 103e for the critical path. This is because the f-max measurement requires that data be set to all of the SCAN F/F(1) 103a to the SCAN F/F(5) 103e for the critical path at a time. When the F/F chain circuit 103 is used, however, a difference in time inevitably occurs in setting of the data to the SCAN F/F(1) 103a to the SCAN F/F(5) 103e. For such a reason, the operating frequency measurement test conventionally has a problem that much time is taken to identify the test vector that enables the f-max measurement, which is one of factors that obstruct the development of a logic circuit.

On the other hand, the stress test is a test for inspecting the tolerance of a logic circuit by applying a load on the logic circuit. One of such stress tests is a burn-in test. In the burn-in test, an output of a first stage gate constituting a net is continuously repeatedly toggled, that is, a signal "0" and a signal "1" are alternately repeatedly output to the first stage gate, thereby inspecting the tolerance of the logic circuit.

FIG. 8 shows one example of the conventional stress test (burn-in test). It is to be noted that the following will describe a case of performing the burn-in test by the use of a SCAN test F/F chain circuit which is obtained by connecting a plurality of clock synchronization type F/Fs in the form of a SCAN chain.

In the burn-in test, a test vector 202 for the burn-in test given from the outside of a logic circuit 201, or a test vector for the burn-in test generated from a vector generation circuit 203 provided in the logic circuit 201 is sequentially set to, for example, each of a SCAN F/F(1) 204a to a SCAN F/F(4) 204d of a SCAN test F/F chain circuit 204. Then, the SCAN F/F clock signal clk is applied to each of the SCAN F/F(1) 204a to SCAN F/F(4) 204d, whereby each net is activated. In the case of this example, the burn-in test is realized by repeatedly reversing (inverting) the test vector which is set to each of these SCAN F/F(1) 204a to SCAN F/F(4) 204d to continue toggling the respective nodes.

In a stress test including this burn-in test, however, to continue toggling the respective nodes, it is necessary to repeatedly apply a reversed test vector (for example, signal "0" or signal "1") to each of the SCAN F/F(1) 204a to the SCAN F/F(4) 204d from either the outside or inside of the logic circuit 201. Therefore, the stress test is very troublesome to conduct and takes much of time, disadvantageously.

Thus, conventionally, there has been a problem that much time is required to identify a test vector that enables the f-max measurement in an operating frequency measurement test.

There has been another conventional disadvantage of very troublesome and time consuming application of a test vector for the purpose of continuing to toggle the respective nodes in a stress test.

BRIEF SUMMARY OF THE INVENTION

According to a first aspect of the present invention, there is provided a logic circuit comprising a flip-flop chain circuit which is utilized in a scan test of a combinational circuit, the flip-flop chain circuit including a plurality of flip-flops each of which is provided with a selector.

According to a second aspect of the present invention, there is provided a logic circuit designing method comprising: designing a combinational circuit which realizes a desired function operation; logically synthesizing the thus designed combinational circuit by the use of a variety of gates; and designing a flip-flop chain circuit, which is utilized in a scan test of the thus logically synthesized combinational circuit, by the use of a plurality of flip-flops each of which is provided with a selector.

According to a third aspect of the present invention, there is provided a method of testing a logic circuit including a flip-flop chain circuit, which is utilized in a scan test of a combinational circuit, by the use of a plurality of flip-flops each of which is provided with a selector, the method comprising applying inversion values of set values to a maximum delay path of the combinational circuit, as operating frequency measurement test vectors, using the flip-flop chain circuit in an operating frequency measurement test, the inversion values being obtained by inverting the set values at a time by the selectors and set to the plurality of flip-flops, respectively.

According to a fourth aspect of the present invention, there is provided a method of testing a logic circuit including a flip-flop chain circuit, which is utilized in a scan test of a combinational circuit, by the use of a plurality of flip-flops each of which is provided with a selector, the method comprising applying inversion values of set values to a node of the combinational circuit, as stress test vectors, using the flip-flop chain circuit in a stress test, the inversion values being obtained by repeatedly inverting the set values by the selectors and set to the plurality of flip-flops, respectively.

DETAILED DESCRIPTION OF THE INVENTION

Embodiments of the present invention will be described in further detail with reference to the accompanying drawings.

(First Embodiment)

Figure 1:
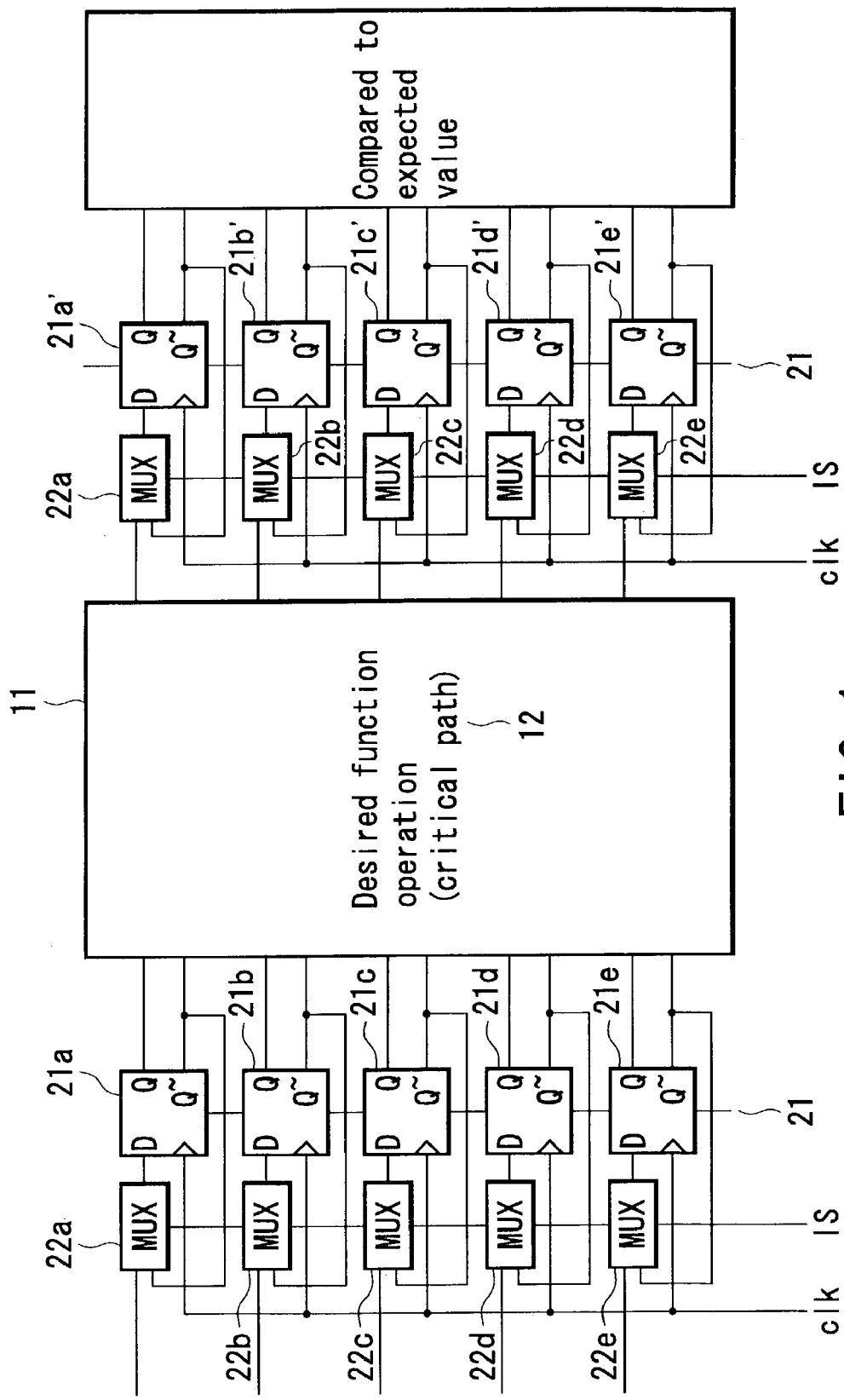
FIG. 1 is a block diagram for showing one example of operating frequency measurement test (f-max measurement) for a logic circuit according to a first embodiment of the present invention.

FIG. 1 shows a method for testing a logic circuit according to a first embodiment of the present invention. As one example thereof, an operating frequency measurement test (f-max measurement) is described as follows.

In the present embodiment, this f-max measurement is performed by the use of a flip-flop (F/F) chain circuit 21 which is utilized in a SCAN test to be conducted on a combinational circuit 11. The F/F chain circuit 21 comprises, for example, a SCAN F/F(1) 21a to a SCAN F/F(5) 21e which are connected in the form of a SCAN chain. Each of these SCAN F/F(1) 21a to SCAN F/F(5) 21e is constituted of a clock synchronization type flip-flop which is provided with a selector.

Figure 2:
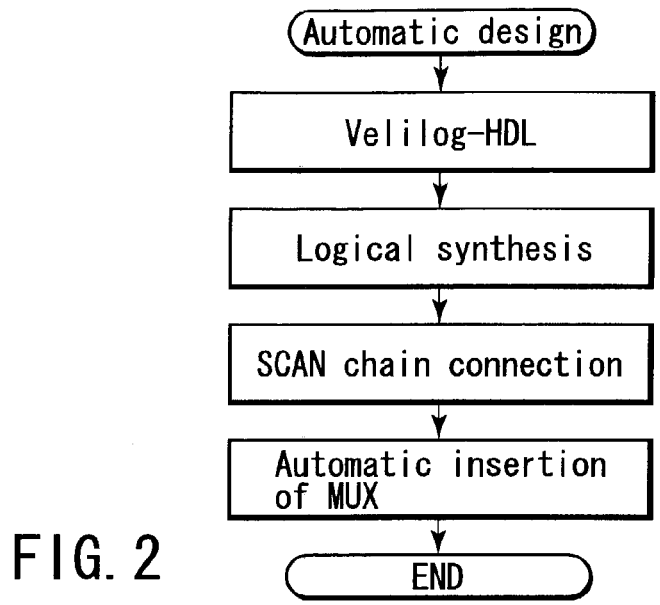
FIG. 2 is a flow chart for showing one example of a program which automatically designing the logic circuit of FIG. 1.

That is, to data input terminals (input stages) D of these SCAN F/F(1) 21a to SCAN F/F(5) 21e are there respectively connected a MUX (Multiplexer) 22a to a MUX22e, each of which serves as a selector. These MUX22a to MUX22e are automatically inserted when, for example, a program (tool which generates a SCAN test F/F chain circuit) shown in FIG. 2. is. executed which designs a logic circuit automatically. The MUX22a to the MUX22e each serve to invert each set value of the SCAN F/F(1) 21a to SCAN F/F(5) 21e respectively, in such a manner that when, for example, a MUX inversion value select signal IS, which is a control signal, is high (in the case of the f-max measurement), a signal (inversion value of each set value) which appears at each inversion output terminal (Q~) of the SCAN F/F(1) 21a to SCAN F/F(5) 21e may be supplied to each data input terminal D of these SCAN F/F(1) 21a to SCAN F/F(5) 21e. Therefore, by beforehand setting an inversion value (second test vector) of operating frequency measurement test vectors to each of the SCAN F/F(1) 21a to SCAN F/F(5) 21e, it is possible to easily obtain an operating frequency measurement test vector (first test vector).

That is, a second test vector which is supplied from the outside of the circuit beforehand is set to each of the SCAN F/F(1) 21a to SCAN F/F(5) 21e. Then, each set value (second test vector) for these SCAN F/F(1) 21a to SCAN F/F(5) 21e is inverted at a time. Thus, the first test vector (operating frequency measurement test vector) is created as an f-max measurement test vector.

Figure 3A:
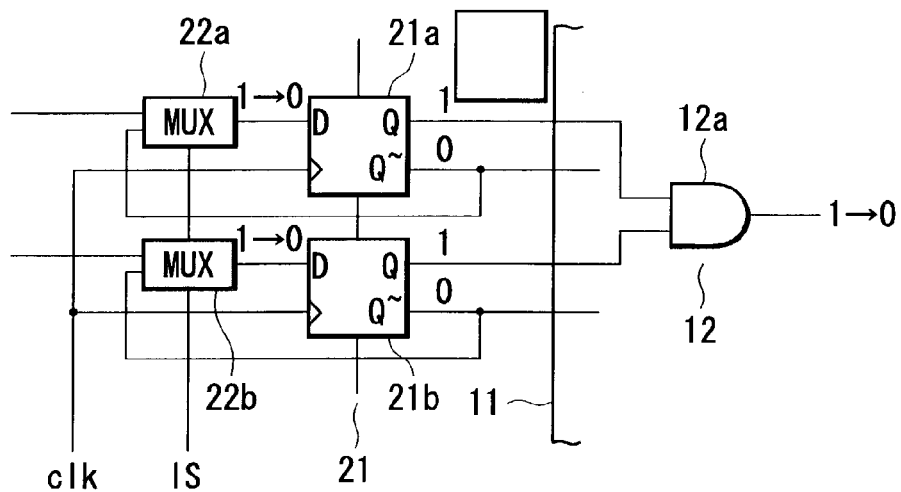
FIGS. 3A and 3B are configuration diagrams of a combinational circuit (critical path) for showing by comparison a case where f-max measurement can be valid and a case where it cannot be valid in the logic circuit of FIG. 1.
Figure 3B:
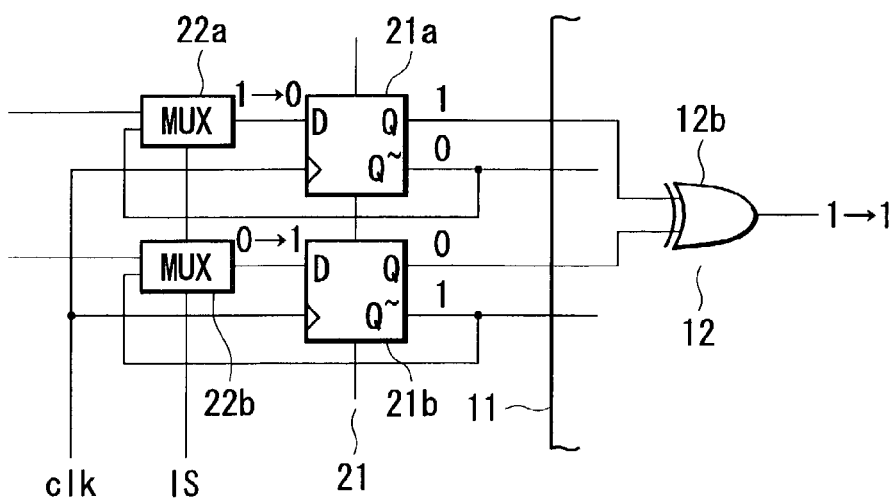

FIG. 3A shows a configuration example of a critical path (path that encounters a maximum signal propagation time in the combinational circuit 11) 12 in a case where the f-max measurement can be valid in realization of the f-max measurement, while FIG. 3B shows a configuration example in a case where this f-max measurement cannot be valid.

In the present embodiment, if, as shown in FIG. 3B for example, the output of a first stage gate (EXOR) 12b of the critical path 12 does not change from 1 to 0 in logic level (that is, remains at 1 in logic level) despite that set values for the SCAN F/F(1) 21a and the SCAN F/F(2) 21b have been inverted from 1 to 0 and from 0 to 1 in logic level respectively, precise f-max measurement cannot be performed. Therefore, the critical path 12 according to the present embodiment has such a path configuration that, as shown in FIG. 3A for example, the output of a first stage gate (AND) 12a may be sure to change (be inverted) from 1 to 0 in logic level when set values for the SCAN F/F(1) 21a and the SCAN F/F(2) 21b are both inverted from 1 to 0.

Figure 4:
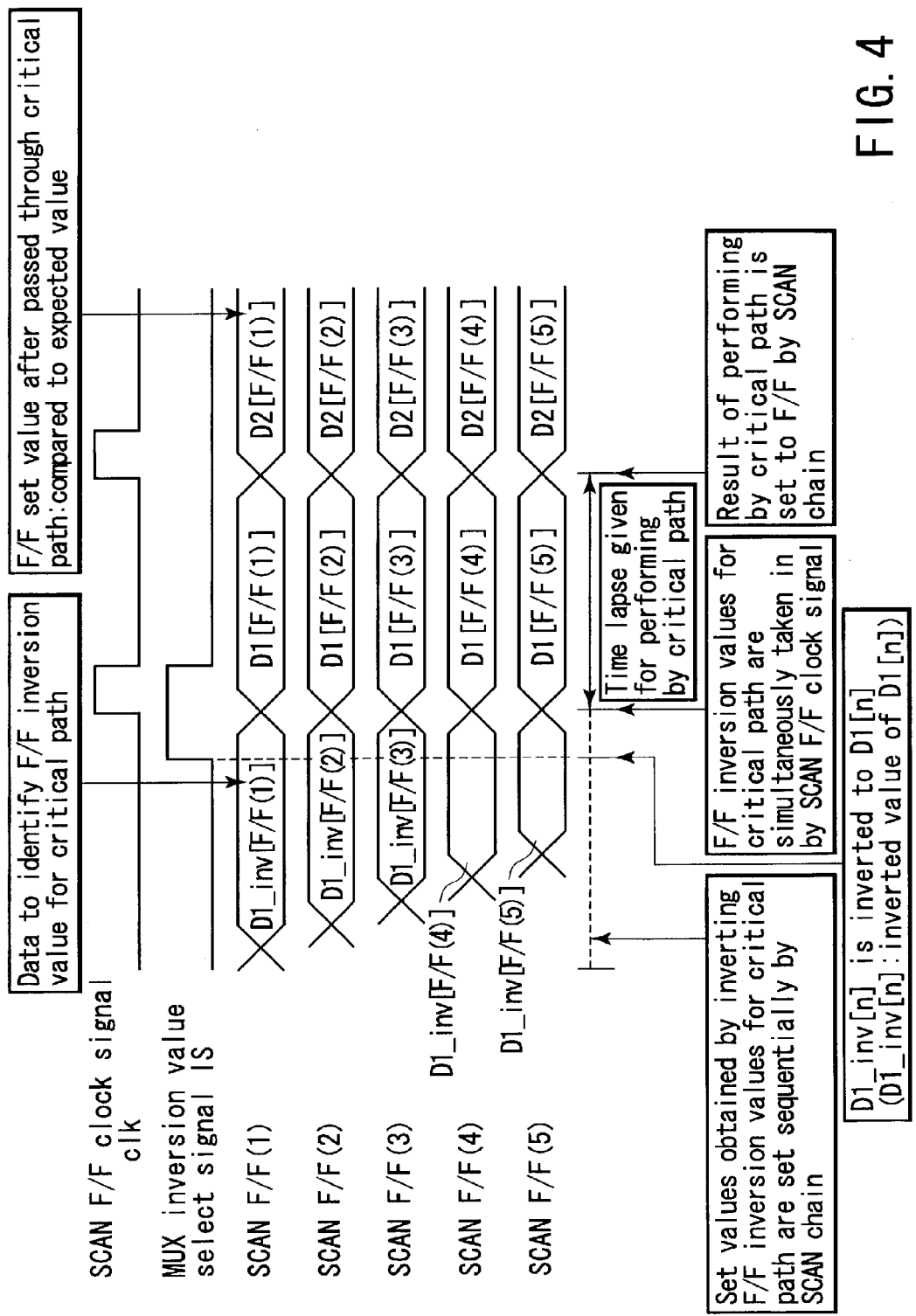
FIG. 4 is a timing chart for explaining an f-max measurement method in the logic circuit of FIG. 1.

To realize the f-max measurement, first the critical path 12 of the combinational circuit 11 is searched for based on a result of a timing analysis etc. Subsequently, to cause this critical path 12 to perform a desired function operation, a second test vector obtained by inverting a first test vector is supplied from the outside of the circuit. This second test vector is sequentially set to the SCAN F/F(1) 21a to the SCAN F/F(5) 21e of the F/F chain circuit 21. That is, in actual f-max measurement, as shown in FIG. 4 for example, data to identify the first test vector which activates the critical path 12, that is, the second test vector D1_inv[n] (in this example, [n]=[F/F(1)]–[F/F(5)]) is set to each of the SCAN F/F(1) 21a to the SCAN F/F(5) 21e of the F/F chain circuit 21. Furthermore, the second test vector D1_inv[n] is inverted at a time when the MUX inversion value select signal (high) IS is supplied to each of the MUX22a to MUX22e, thus providing the first test vectors D1[n]. This first test vector D1[n] is set at a time to each of the SCAN F/F(1) 21a to the SCAN F/F(5) 21e as an inversion value for the critical path F/Fs, in response to the application of a SCAN F/F clock signal clk. This activates the critical path 12 so that it may perform a desired function operation based on the first test vectors D1[n].

Then, when one cycle of the clock signal clk is applied, as a result of the performing of the function operation, a value of the D2[n] is set to each of SCAN F/F(1) 21a' to SCAN F/F(5) 21e' of the F/F chain circuit 21 (in this case, these SCAN F/F(1) 21a' to SCAN F/F(5) 21e' are the same F/Fs as the SCAN F/F(1) 21a to SCAN F/F(5) 21e and have a time difference corresponding to a time lapse given to the performing by the critical path 12). After passing through the critical path 12, the set values (D2[n]) for these SCAN F/F(1) 21a' to SCAN F/F(5) 21e' are compared to an expected value which is anticipated on the basis of a design value of the combinational circuit 11. By thus reducing the time lapse (period of the clock signal clk) given to the performing by the critical path 12 gradually, an operating frequency that marginally agrees with the expected value is obtained. That is, by obtaining a time lapse given to the performing by the critical path 12 immediately before the expected value and the performing result D2[n] begin to disagree with each other, a maximum operable frequency (maximum operating frequency) is measured.

As described above, the present embodiment enables easy creation of the first test vector D1[n] which serves to activate the critical path 12. That is, the first test vector D1[n] which causes the critical path 12 to perform a desired function operation can be created by inverting the second test vector D1_inv[n]. It is thus made easily possible to identify the first test vector D1[n] without any necessity of a complicated and troublesome job of identifying a set value (D0[n]) for a SCAN F/F, of the desired function operation, which is obtained one cycle before the operation. It is, therefore, possible to simplify the operating frequency measurement test and greatly mitigate the burdens on testing.

In particular, obtaining the second test vector D1_inv[n] is much simpler than conventional identification of the second test vector D0[n], with fewer mistakes involved.

Furthermore, in the case of the present embodiment, it is easily possible to automatically design an F/F chain circuit incorporating MUXes, by executing a generation tool. That is, an F/F chain circuit according to the present embodiment can be easily constituted by, for example, inserting a MUX at the input stage of each F/Fs which are connected in the form of a SCAN chain of a logically synthesized circuit or replacing each of the F/Fs connected in the form of the SCAN chain in the logically synthesized circuit with an F/F which is provided with a MUX. It is thus possible to cut or reduce the design resource time in developments of a logic circuit.

(Second Embodiment)

Figure 5:
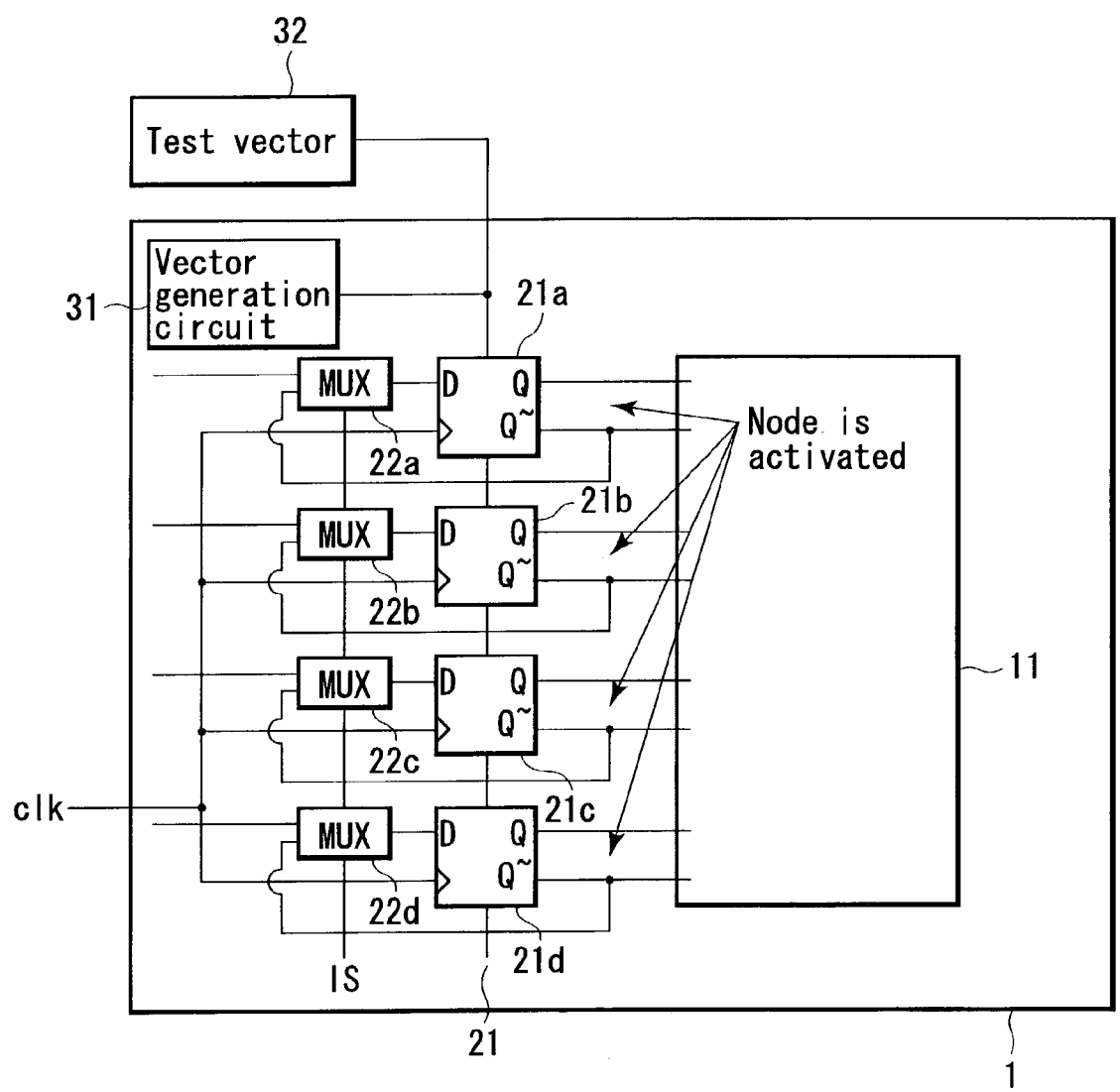
FIG. 5 is a block diagram for showing one example of a logic circuit stress test (burn-in test) according to a second embodiment of the present invention.
Figure 6:
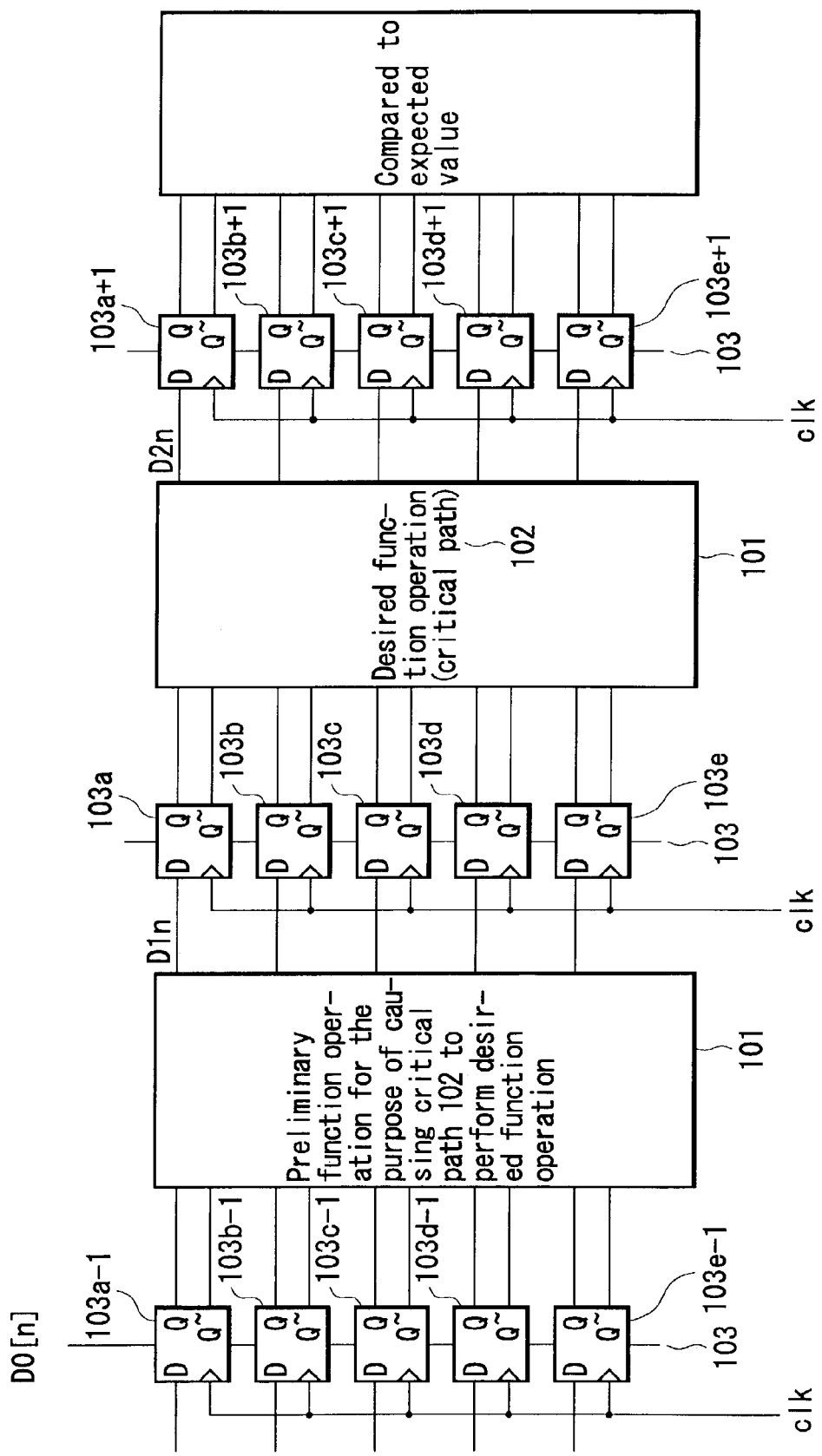
FIG. 6 is a block diagram for showing one example of the f-max measurement in a conventional logic circuit.
Figure 7:
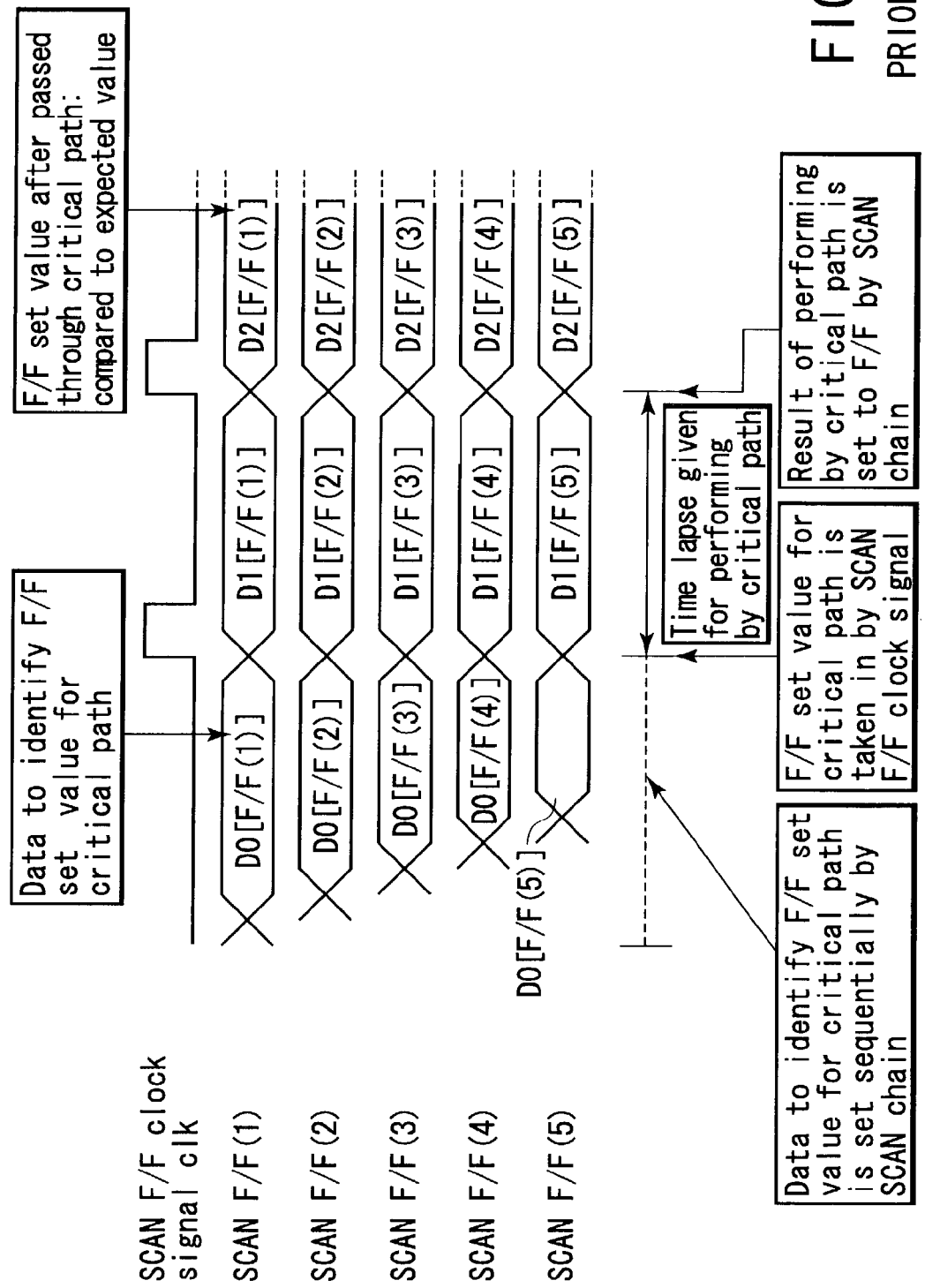
FIG. 7 is a timing chart for explaining a f-max measurement method in the conventional logic circuit.
Figure 8:
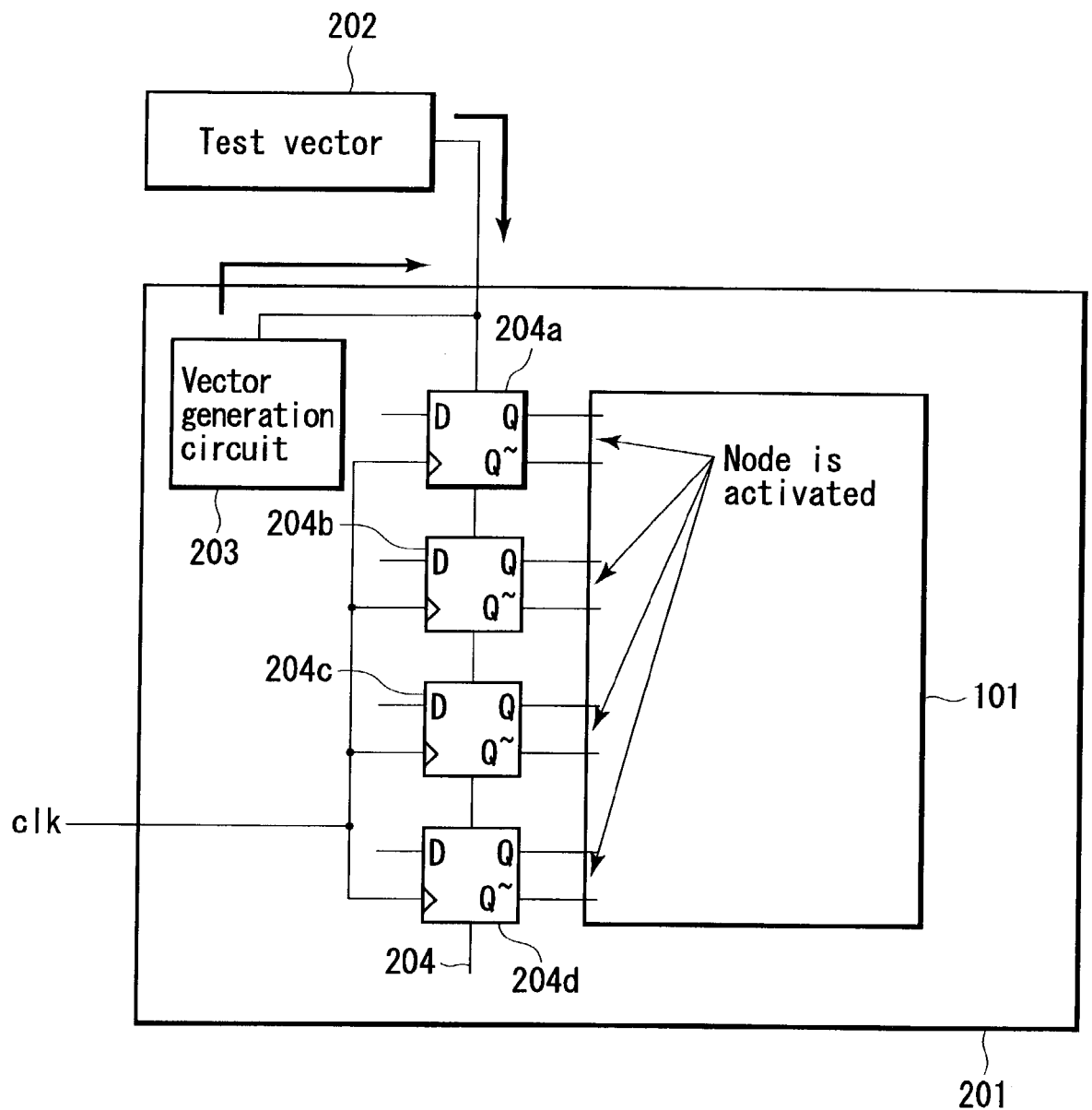
FIG. 8 is a block diagram for showing one example of a burn-in test in the conventional logic circuit.

FIG. 5 shows a method for testing a logic circuit according to a second embodiment of the present invention. As one example thereof, a stress test (burn-in test) is described as follows.

A burn-in test is conducted by the use of the F/F chain circuit 21 which is utilized in a SCAN test of a combinational circuit 11. In the case of the present embodiment, this F/F chain circuit 21 comprises a SCAN F/F(1) 21a to a SCAN F/F(4) 21d which are constituted of clock synchronization type F/Fs provided with selectors (a MUX22a to a MUX22d) and also which are connected in the form of a SCAN chain. That is, in an actual burn-in test, either a test vector (second test vector) which is generated by a vector generation circuit 31 provided inside a logic circuit 1 or a test vector (second test vector) 32 provided from the outside of the logic circuit 1 is supplied to each of the SCAN F/F(1) 21a to the SCAN F/F(4) 21d of the F/F chain circuit 21.

It is to be noted that this second test vector given as a set value refers to data which is used to create the later-described first test vector (vector used in a stress test) for the purpose of continuing to activate each net (node). That is, this first test vector is adapted to be created by repeatedly inverting this second test vector.

To realize a burn-in test, the first test vector generated by the vector generation circuit 31 or the second test vector 32 provided from the outside of the circuit 1 is set sequentially to the SCAN F/F(1) 21a to the SCAN F/F(4) 21d of the F/F chain circuit 21. That is, in an actual burn-in test, the second test vector to create the first vector which continues to activate each node is set to each of the SCAN F/F(1) 21a to the SCAN F/F(4) 21d of the F/F chain circuit 21. This second test vector is repeatedly inverted in response to the supply of the MUX inversion value select signal (high) IS to the MUX22a to MUX22d, thus providing the first test vector (inversion value). In this case, when this MUX inversion value select signal IS becomes high in level, the MUX22a to the MUX22d consecutively supply signals which appear at the inversion output terminals (Q~) of the SCAN F/F(1) 21a to SCAN F/F(4) 21d to the data input terminals D of these SCAN F/F(1) 21a to SCAN F/F(4) 21d. That is, the MUX22a to the MUX22d permanently toggle the second test vector which is set to the SCAN F/F(1) 21a to SCAN F/F(4) 21*d*. This causes the first test vector (stress test vector) to be created as a test vector which is used in a burn-in test.

The first test vector continues to activate each net (node) in response to the application of a SCAN F/F clock signal clk. By thus continuing to apply a load on each node, a burn-in test is realized.

In accordance with this second embodiment, it is possible to easily create the first test vector which serves to continue activating each node. That is, only by continuing to apply the clock signal clk, it is made possible to toggle a stress test vector permanently.

It is thus made possible easily to continue activating each node without a necessity of a very troublesome job of alternately applying inverted test vectors. It is, therefore, possible to realize simplification of a stress test such as a burn-in test, thus greatly mitigating a burden on the test.

In addition, it is possible not only to reduce the test time by such simplification but also to simply increase or decrease the number of times of toggling only by controlling the clock signal, thus segmenting the test.

Furthermore, as in the case of the first embodiment, an F/F chain circuit incorporating MUXes can be designed automatically by executing a generation tool, thus cutting or reducing the design resource time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A logic circuit comprising a flip-flop chain circuit which is utilized in a scan test of a combinational circuit, the flip-flop chain circuit including a plurality of flip-flops each of which is provided with a selector,
wherein the flip-flop chain circuit is utilized in an operating frequency measurement test, and
in the operating frequency measurement test, the flip-flop chain circuit sets, at a time, to the plurality of flip-flops, an inversion value of each set value which is set to each of the plurality of flip-flops, in response to a control signal which is supplied to each selector.

2. The logic circuit according to claim 1, wherein the plurality of flip-flops of the flip-flop chain circuit are connected in the form of a scan chain.

3. The logic circuit according to claim 1, wherein as each of the plurality of flip-flops, a clock synchronization type flip-flop is used.

4. The logic circuit according to claim 1, wherein a multiplexer is used in each selector.

5. The logic circuit according to claim 1, wherein in the operating frequency measurement test, the flip-flop chain circuit applies, to a maximum delay path of the combinational circuit, the inversion value which is set to each of the plurality of flip-flops, as an operating frequency measurement test vector.

6. The logic circuit according to claim 5, wherein the maximum delay path includes, at a first stage thereof, a gate whose output is inverted when provided with the operating frequency measurement test vector.

7. A logic circuit comprising a flip-flop chain circuit which is utilized in a scan test of a combinational circuit, the flip-flop chain circuit including a plurality of flip-flops each of which is provided with a selector,
wherein the flip-flop chain circuit is utilized in a stress test, and
in the stress test, the flip-flop chain circuit repeatedly inverts each set value which is set to each of the plurality of flip-flops, in response to a control signal which is supplied to each selector.

8. The logic circuit according to claim 7, wherein in the stress test, the flip-flop chain circuit applies, to a node of the combinational circuit, an inversion value which is inverted repeatedly, as a stress test vector.

9. The logic circuit according to claim 8, wherein the node continues to be activated by being provided with the stress test vector.

10. The logic circuit according to claim 7, wherein the plurality of flip-flops of the flip-flop chain circuit are connected tin the form of a scan chain.

11. The logic circuit according to claim 7, wherein as each of the plurality of flip-flops, a clock synchronization type flip-flop is used.

12. The logic circuit according to claim 7, wherein a multiplexer is used in each selector.

13. A logic circuit designing method comprising:
designing a combinational circuit which realizes a desired function operation;
logically synthesizing the thus designed combinational circuit by the use of a variety of gates; and
designing a flip-flop chain circuit, which is utilized in a scan test of the thus logically synthesized combinational circuit, by the use of a plurality of flip-flops each of which is provided with a selector,
wherein in an operation frequency measurement test, the flip-flop chain circuit sets, at a time, to the plurality of flip-flops, an inversion value of each set value which is set to each of the plurality of flip-flops, in response to a control signal which is supplied to each selector, or in a stress test, the flip-flop chain circuit repeatedly inverts each set value which is set to each of the plurality of flip-flops, in response to a control signal which is supplied to each selector.

14. The logic circuit designing method according to claim 13, wherein designing the flip-flop chain circuit includes:
connecting a plurality of logically synthesized flip-flops in the form of a scan chain; and
inserting a selector to each of input stages of the plurality of flip-flops.

15. The logic circuit designing method according to claim 13, wherein designing the flip-flop chain circuit includes:
connecting a plurality of logically synthesized flip-flops in the form of a scan chain; and
replacing each of the plurality of flip-flops with a flip-flop which is provided with the selector.

16. A method of testing a logic circuit including a flip-flop chain circuit, which is utilized in a scan test of a combinational circuit, by the use of a plurality of flip-flops each of which is provided with a selector, the method comprising applying inversion values of set values to a maximum delay path of the combinational circuit, as operating frequency measurement test vectors, using the flip-flop chain circuit in an operating frequency measurement test, the inversion values being obtained by inverting the set values at a time by the selectors and set to the plurality of flip-flops, respectively.

17. The logic circuit testing method according to claim 16, wherein the maximum delay path includes, at a first stage thereof, a gate whose output is inverted when provided with the operating frequency measurement test vector.

18. A method of testing a logic circuit including a flip-flop chain circuit, which is utilized in a scan test of a combinational circuit, by the use of a plurality of flip-flops each of which is provided with a selector, the method comprising applying inversion values of set values to a node of the combinational circuit, as stress test vectors, using the flip-flop chain circuit in a stress test, the inversion values being obtained by repeatedly inverting the set values by the selectors and set to the plurality of flip-flops, respectively.

19. The logic circuit testing method according to claim 18, wherein the node continues to be activated by being provided with the stress test vector.

* * * * *